United States Patent [19]
Sprintschnik

[11] 4,395,480
[45] Jul. 26, 1983

[54] DEVELOPER MIXTURE AND PROCESS FOR DEVELOPING EXPOSED NEGATIVE-WORKING DIAZONIUM SALT LAYERS

[75] Inventor: Gerhard Sprintschnik, Hofheim, Fed. Rep. of Germany

[73] Assignee: Hoechst Aktiengesellschaft, Fed. Rep. of Germany

[21] Appl. No.: 337,396

[22] Filed: Jan. 6, 1982

[30] Foreign Application Priority Data

Jan. 8, 1981 [DE] Fed. Rep. of Germany ....... 3100259

[51] Int. Cl.³ ............................ G03C 1/58; G03C 5/30
[52] U.S. Cl. .................................. 430/309; 430/175; 430/325; 430/331
[58] Field of Search ............................ 252/108, 174.21; 430/175, 309, 325, 331

[56] References Cited

U.S. PATENT DOCUMENTS

| | | | |
|---|---|---|---|
| 3,201,241 | 8/1965 | Munder et al. | 430/331 |
| 3,208,949 | 9/1965 | Rosnati | 252/174.21 |
| 3,669,660 | 6/1972 | Golda et al. | 430/331 |
| 3,701,657 | 10/1972 | Moore et al. | 430/331 |
| 4,147,545 | 4/1979 | Rowe et al. | 430/331 |
| 4,186,006 | 1/1980 | Kobayashi et al. | 430/331 |
| 4,350,756 | 9/1982 | Burch et al. | 430/331 |

FOREIGN PATENT DOCUMENTS

| | | |
|---|---|---|
| 1047016 | 12/1958 | Fed. Rep. of Germany . |
| 2809774 | 9/1979 | Fed. Rep. of Germany . |
| 1515174 | 6/1978 | United Kingdom . |

*Primary Examiner*—Mary F. Downey
*Attorney, Agent, or Firm*—James E. Bryan

[57] ABSTRACT

The invention relates to a developer mixture for developing exposed, light-sensitive reproduction layers which contain a diazonium salt polycondensation product. The mixture comprises water, a salt of an alkanoic acid and a surfactant and contains 0.5 to 15 percent by weight, in particular 1 to 10 percent by weight, of at least one salt of an alkanoic acid having 8 to 13 carbon atoms and 0.5 to 20 percent by weight, in particular 1 to 12 percent by weight, of at least one low-foaming, non-ionic surfactant. These surfactants preferably include optionally modified block polymers formed from ethylene oxide and propylene oxide.

The invention also relates to a process for developing negative-working reproduction layers, of the composition indicated above, with the developer mixture according to the invention.

4 Claims, No Drawings

DEVELOPER MIXTURE AND PROCESS FOR DEVELOPING EXPOSED NEGATIVE-WORKING DIAZONIUM SALT LAYERS

The invention relates to a developer mixture and process which is suitable for developing neagtive-working, exposed reproduction layers containing a diazonium salt polycondensation product, in copying materials.

Copying materials of this type are used, in particular, in the preparation of printing plates and also photoresists; they are composed of a layer support and a negative-working, light-sensitive reproduction layer. The layer supports used in these copying materials are metals, such as zinc, chromium, copper, brass, steel, aluminum or combinations of these metals, plastic films, paper or similar materials. These layer supports can be coated with the light-sensitive reproduction layer without modification by pretreatment, but preferably are coated after carrying out a modification of the surface, such as a mechanical, chemical or electrochemical roughening, an oxidation and/or a treatment with hydrophilizing agents (for example in the case of offset printing plate supports). The reproduction layers to be developed in accordance with the invention contain water-insoluble diazonium salt polycondensation products. In addition to the light-sensitive component, the reproduction layers also can contain plasticizers, pigments, dyestuffs, wetting agents, sensitizers, indicators and other customary auxiliaries. Such reproduction layers are described in detail, for example in German Offenlegungsschrift No. 2,065,732 (equivalent to U.S. Pat. No. 3,867,147).

A developer for negative-working reproduction layers must be able to dissolve out, from the exposed layer, the parts of the layer (the subsequent non-image areas) which have not been affected by electromagnetic radiation (for example light), without having an appreciable effect on the parts of the layer (the subsequent image areas) which have been affected by the radiation. The following are generally suitable for this purpose in the German Offenlegungsschrift cited above: water, water-/organic solvent mixtures, aqueous salt solutions, aqueous solutions of acids, aqueous-alkaline solutions and undiluted organic solvents, to which, if appropriate, surfactants and/or hydrophilizing agents can be added. The developers which are mainly employed in the examples contain water, Na laurylsulfate, Na sulfate, tartaric acid and, in some cases, benzyl alcohol; other developers contain or are composed of isopropanol, n-propanol, n-propyl acetate, polyacrylic acid, 1,1,1-trichloroethane, acetone or ethylene glycol monomethyl ether.

The following developers or developer mixtures also have been disclosed in the state of the art:

German Auslegeschrift No. 1,047,016, describes the addition of 3 to 5 percent by weight of propylene oxide/ethylene oxide block polymers containing terminal ethylene oxide units into an aqueous developer containing phosphoric acid for light-sensitive colloid layers of planographic printing plates containing diazonium compounds.

The aqueous alkaline developers of German Auslegeschrift No. 1,193,366 (equivalent to U.S. Pat. No. 3,201,241) for negative layers of planographic printing plates contain 0.3 to 5 percent by weight of alkalies, 0.001 to 0.5 percent by weight of specific cations, such as $Ca^{2+}$, $Sr^{2+}$ or $Ba^{2+}$, 0.001 to 0.25 percent by weight of complexing agents such as tartaric acid, ascorbic acid or ethylenediaminetetraacetic acid, and 0.2 to 0.8 percent by weight of water-soluble polymers such as polyethylene glycols or cellulose ethers. If the p-quinone diazides, as negative layers containing a light-sensitive compound, also contain binders, organic solvents, such as ethylene glycol monomethyl ether, generally are also added to the developer.

A non-aqueous developer for planographic printing plates which has a photopolymerizable resin is known from German Auslegeschrift No. 1,772,457 (equivalent to U.S. Pat. No. 3,701,657); this developer contains an organic solvent, a low-molecular surfactant and, if appropriate, as a hydrophilizing agent a low-molecular acid, such as citric acid or phosphoric acid, or a hydrophilic colloid, such as carboxymethylcellulose. Alkylarylsulfonic acids and polycondensation products formed from ethylene oxide and alcohols, fatty alcohols, alkylphenols or fatty amines are exemplary of suitable surfactants.

The developer for negative layers of German Offenlegungsschrift No. 2,124,672 (equivalent to U.S. Pat. No. 3,669,660) contains water and a water-soluble sulfonic acid (in particular aromatic compounds) or one of the water-soluble salts of the latter and, if appropriate, a water-soluble organic solvent, a surfactant and an acid, such as phosphoric acid. The light-sensitive layers to be developed are stated to be constituted on a basis of p-diazodiphenylamine; the developer contains 5 to 25 percent by weight of the sulfonic acid compound, 0 to 20 percent by weight of the organic solvent, up to 5 percent by weight of the surfactant (for example Na laurylsulfate) and up to 5 percent by weight of the acid.

German Offenlegungsschrift No. 2,353,992 (equivalent to U.S. Pat. No. 4,147,545) describes a developer for negative layers which contains a water-soluble lithium salt of an organic compound having at least one acidic H atom and, if appropriate, an amphoteric surfactant. Suitable lithium salts include, inter alia, Li dodecanoate, laurylsulfonate, chloroacetate, caprylate, stearate and oleate, and they are added to the aqueous solution in a proportion of 1 to 25 percent by weight; the amphoteric surfactant can be present in the developer in a proportion of up to 50 percent by weight. In addition, the developer also can contain up to 30 percent by weight of an organic solvent and up to 5 percent by weight of phosphoric acid or oxalic acid. The light-sensitive layer to be developed is constituted on a basis of water-insoluble diazonium compounds or photopolymerizable compounds.

The amphoteric surfactants contain both a grouping having a basic nitrogen atom and a grouping having an acid function, such as a carboxyl, sulfate, sulfonate or phosphate radical. Ionic or nonionic surfactants also can be added in a proportion of 5 to 10 percent by weight, polyethylene glycol ethers of alcohols or alkylphenols are mentioned, inter alia.

The developer for treating negative layers containing diazonium salt polycondensation products according to German Offenlegungsschrift No. 2,530,502 (equivalent to British Pat. No. 1,515,174) contains a major proportion of water, a smaller quantity of an organic solvent and a water-soluble colloid. In addition, such a developer also can contain up to 10 percent by weight of a surfactant and up to 20 percent by weight of a salt or an acid (inter alia sulfates, phosphates, nitric acid or phosphoric acid); Na laurylsulfate, alkyl polyethylene glycol ethers and alkylphenol polyethylene glycol ethers are exemplary of suitable surfactants.

A developer for light-sensitive layers containing a water-insoluble diazo resin and a hydrophobic resin is known from German Offenlegungsschrift No. 2,744,097 (equivalent to U.S. Pat. No. 4,186,006); this developer contains (a) benzyl alcohol or ethylene glycol monophenyl or monobenzyl ether, (b) an anionic surfactant, and (c) a water-soluble sulfite.

The developer of German Offenlegungsschrift No. 2,809,774, for light-sensitive negative layers containing a diazonium salt polycondensation product is based on 0.5 to 15 percent by weight of an anionic surfactant, 0.5 to 6 percent by weight of a poly-N-vinyl-N-methylacetamide, 1 to 5 percent by weight of polyvinyl alcohol, 0.5 to 6 percent by weight of a salt, 0.5 percent by weight up to saturation concentration of benzyl alcohol and 0.5 percent by weight up to saturation concentration of glycerol triacetate.

However, the developers or developer mixtures known from the state of the art described above exhibit, in particular, the following disadvantages:

They often contain organic solvents which ought, as far as possible, no longer to be present in modern developers, for ecological reasons (low boiling point, fire risk, unpleasant odor, harmful effect on effluent and exit air or expensive precautions for removing the solvents after development).

Although laurylsulfate or other alkanesulfates or alkanesulfonates, which often have been used in practice hitherto, are in themselves active developer components for the light-sensitive reproduction layers described, nevertheless they require a relatively long developing time, they foam excessively in processing machines, particularly in the case of vertical developing, and their solubility in water at low temperatures (for example below about 10° C.) falls off to such an extent that, in autumn or winter temperatures, flocculant residues which often cause problems for the processor can be formed in the stock solutions. Grease spots and residues of adhesives, such as can occur when offset printing plates are handled under practical conditions, are removed by these developer components only after a long period of treatment and by means of additional mechanical aids.

Although they are frequently suitable when used for the special reproduction layers for which they were developed and with which they were employed successfully in the relevant examples, in the case of layers differing from these special reproduction layers, they exhibit difficulties of varying importance; that is to say a special light-sensitive reproduction layer, such as is constituted by the layer to be developed in the present case, as a rule also requires a special developer or a special developer system.

The object of the present invention is to provide a developer for developing light-sensitive reproduction layers based on a diazonium salt polycondensation product which, in particular, are free from water-insoluble binding agents, the developer ensuring rapid and complete dissolution of the unexposed areas of the layer, without attacking the exposed areas of the layer, and which is suitable for use in automatic developing machines.

The invention is based on a developer mixture for developing exposed, light-sensitive reproduction layers comprising water, a salt of an alkanoic acid and a surfactant. The developer mixture according to the invention is suitable for reproduction layers containing a diazonium salt polycondensation product, and it contains water, 0.5 to 15 percent by weight of at least one salt of an alkanoic acid having 8 to 13 carbon atoms, and 0.5 to 20 percent by weight of at least one low-foaming, nonionic surfactant.

Examples of reproduction layers which can be developed using the developer mixture according to the invention have been described in German Offenlegungsschrift No. 2,065,732 (equivalent to U.S. Pat. No. 3,867,147), which already has been mentioned in the introduction. In addition to the light-sensitive compound, the diazonium salt polycondensation product, these layers also can contain other components, but this is not absolutely necessary. In particular, they do not contain any water-insoluble binding agents.

The main constituent of the developer according to the invention is water; in addition, it contains the components described. The salts of the alkanoic acid normally have an $Na^+$, $NH_4^+$, or $K^+$ ion as the cation and they preferably should be soluble in water; the anion of these salts is derived from the particular alkanoic acid: octanoic acid = caprylic acid (octanoate anion), nonanoic acid = pelargonic acid (nonanoate), decanoic acid = capric acid (decanoate), undecanoic acid (undecanoate), dodecanoic acid = lauric acid (dodecanoate) and tridecanoic acid (trideconate). Among the salts, those of alkanoic acids having 9 to 12 carbon atoms are preferred.

The other component of the developer mixture according to the invention is formed by low-foaming, nonionic surfactants, that is to say surfactants which, although they have a good to useful wetting action and reduce the surface tension of water, nevertheless also exhibit a good foam-suppressing power. These compounds preferably include block polymers formed from ethylene oxide and propylene oxide, which can, if appropriate, be modified by additional molecules. Examples of such compounds are block polymers formed from 90 percent by weight of propylene oxide and 10 percent by weight of ethylene oxide, from 80 percent by weight of propylene oxide and 20 percent by weight of ethylene oxide and from 60 percent by weight of propylene oxide and 40 percent by weight of ethylene oxide, in which the ethylene oxide units are terminal, and block polymers formed from ethylenediamine, ethylene oxide and propylene oxide and from a fatty alcohol and ethylene oxide and propylene oxide, in which the propylene oxide units or the ethylene oxide units can be terminal.

In a preferred embodiment, the developer mixture according to the invention contains 1 to 10 percent by weight of the salt of the alkanoic acid and 1 to 12 percent by weight of the surfactant. The developer mixture also can contain, in addition, auxiliaries, for example complexing agents (sequestering agents), in order to make it possible to prevent any polyvalent ions (for example $Ca^{2+}$) which may be present in the water from having a harmful effect (formation of "lime soaps") on the salt-developer component; for this reason, phosphates (for example polyphosphates) in particular are added to the developer mixture, and other complexing agents, such as citric acid or ethylenediaminetetraacetic acid or salts thereof are also possible.

Because no low-boiling constituents, such as organic solvents, are present in the developer mixture, the developer does not change substantially in composition during use and thus has a relatively long service life in developing devices, such as machines. In general, the developer mixture according to the invention is neutral to slightly alkaline (pH values from about 6 to 9). The developer mixture according to the invention exhibits no troublesome odor nuisance and it has no tendency, or only an insignificant tendency, to foam; even at temperatures around the freezing point no precipitation takes place within the claimed range of quantities of the components. Residues of adhesive (for example from glueing the film originals when copying) and grease spots (for example from punching the printing plates) can be removed without effort even when the developer acts only for a fairly short time. Compared with conventional developers, the speed of developing is greatly increased without a decrease in the developer resistance of the image areas being observable. As fairly short-chain "soaps", the salts of the alkanoic acids can be degraded relatively easily, and the low-foaming surfactants employed also have been used in practice for years, for example on a large scale in dishwashing agents.

The examples which follow illustrate the invention in greater detail; a polycondensation product formed from 3-methoxydiphenylamine-4-diazonium sulfate and 4,4'-bis-methoxymethyl diphenyl ether is employed in the examples as a representative example of a diazonium salt polycondensation product, but other products can, of course, also be employed. Percentages relate to weight and parts by weight are related to parts by volume as g are to ml.

EXAMPLE 1

An electrochemically roughened and anodically oxidized aluminum foil in the form of a plate is coated with a solution of 100 parts by weight of ethylene glycol monomethyl ether, 50 parts by weight of tetrahydrofuran, 0.4 part by weight of Crystal Violet, 0.2 part by weight of 85 percent concentration phosphoric acid and 2 parts by weight of a polycondensation product (prepared from 1 mole of 3-methoxydiphenylamine-4-diazonium sulfate and 1 mole of 4,4'-bis-methoxymethyl diphenyl ether in 85 percent concentration phosphoric acid and isolated as the mesitylenesulfonate) in such a way that the weight of the layer after drying is 0.4 g/m$^2$. The light-sensitive offset printing plate is exposed imagewise and developed in a cell using a developer composed of 89 parts by weight of water, 5 parts by weight of Na undecanoate, 3 parts by weight of a block polymer formed from 80 percent of propylene oxide and 20 percent of ethylene oxide, and 3 parts by weight of tetrasodium diphosphate. After as short an immersion time as 5 seconds, screen and fine line structures which meet high standards are developed satisfactorily, but screen peaks are not attacked even after an immersion time of 15 minutes. Several thousand satisfactory prints can be made from the developed plate in an offset printing machine.

If the undecanoate is replaced by an equal quantity of an Na laurylsulfate or of a secondary alkylsulfonate, a treatment time of at least 4 times as long is required in order to obtain comparable results from the point of view of copying technology; this difference is further enhanced if spots of oil or residues of adhesives have to be removed from the plate.

A foam test between an aqueous developer mixture containing the components mentioned initially (without the phosphate) and an aqueous developer containing an equal quantity of Na laurylsulfate gives, after vigorous shaking, considerably less foam in the case of the mixture according to the invention, this foam having fallen to as low a level as 14 mm after 20 seconds and to 4 mm after 60 seconds, while the corresponding values in the case of the other developer are 58 and 50 mm, respectively.

EXAMPLE 2

An offset printing plate is prepared in accordance with the procedure of Example 1, but with a layer weight of 0.2 g/m$^2$, and is dyed with 0.4 part by weight of Rhodamine 6 GDN (C.I. 45,160). After being exposed imagewise, the plate is developed by hand in a dish using the following developer mixture: 83.5 parts by weight of water, 7 parts by weight of Na dodecanoate, 6 parts by weight of a block polymer formed from 90 percent of propylene oxide and 10 percent of ethylene oxide, and 3.5 parts by weight of Na methaphosphate (Graham's salt). The plate is developed satisfactorily in less than 5 seconds at a very low consumption of developer and without the use of pressure and can be used in printing technology in a manner comparable with the data in Example 1.

EXAMPLE 3

An offset printing plate is prepared in accordance with the procedure of Example 1, but having a layer weight of 0.3 g/m$^2$, and is dyed with 0.4 part by weight of Victoria Blue FGA (C.I. Basic Blue 81). After imagewise exposure, the layer is developed satisfactorily in a developing machine at a temperature of 20° C. and a speed of passage of the plate of 1.6 m/minute without treatment with plush-covered rollers, brushes or the like, the developer mixture used being composed of 87 parts by weight of water, 6.5 parts by weight of Na nonanoate, 2.5 parts by weight of the surfactant described in Example 2 and 4 parts by weight of Na tetrapolyphosphate. The developed printing plate can be processed by printing technology in a manner comparable with the data in Example 1.

In the nonanoate is replaced by conventional surfactants, such as alkanesulfates or alkanesulfonates, it is necessary—in order to achieve similar results—either to reduce the speed of passage of the plate significantly, to increase the temperature of the developer greatly and/or to use, in addition, mechanical aid, comprising rotating or oscillating plush rollers or brushes; in addition, the formation of foam then must be restricted by means of antifoaming agents to a level tolerable in practice.

EXAMPLE 4

This Example is carried out in accordance with the procedure of Example 2, but a block polymer formed from ethylene diamine as the initiator molecule, followed by ethylene oxide and at last propylene oxide, is used as the low-foaming surfactant.

It will be obvious to those skilled in the art that many modifications may be made within the scope of the present invention without departing from the spirit thereof, and the invention includes all such modifications.

What is claimed is:

1. A process for developing negative-working reproduction layers containing a diazonium salt polycondensation product, which comprises treating an exposed reproduction layer and dissolving away the unexposed areas of the layer with an aqueous developer mixture containing about 0.5 to 15 percent by weight of at least one salt of an alkanoic acid having 8 to 13 carbon atoms and having an Na+, NH4+ or K+ ion as the cation, and about 0.5 to 20 percent by weight of at least one low-foaming, nonionic surfactant.

2. A process as claimed in claim 1, in which the developer mixture contains 1 to 10 percent by weight of the salt of the alkanoic acid and 1 to 12 percent by weight of the surfactant.

3. A process as claimed in claim 1, in which the developer mixture contains a salt of an alkanoic acid having 9 to 12 carbon atoms in the alkyl radical.

4. A process as claimed in claim 1, in which the surfactant is an optionally modified block polymer formed from ethylene oxide and propylene oxide.

* * * * *